(12) United States Patent
Marr

(10) Patent No.: US 6,867,612 B2
(45) Date of Patent: Mar. 15, 2005

(54) METHOD FOR WAFER-LEVEL BURN-IN STRESSING OF SEMICONDUCTOR DEVICES AND SEMICONDUCTOR DEVICE SUBSTRATES CONFIGURED TO EFFECT THE METHOD

(75) Inventor: Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/218,378

(22) Filed: Aug. 13, 2002

(65) Prior Publication Data

US 2004/0032277 A1 Feb. 19, 2004

(51) Int. Cl.⁷ .............................................. G01R 31/26
(52) U.S. Cl. ...................................................... 324/765
(58) Field of Search ............................... 324/760, 763, 324/765, 158.1; 439/40, 38, 39

(56) References Cited

U.S. PATENT DOCUMENTS

| | | | |
|---|---|---|---|
| 5,654,588 A | 8/1997 | Dasse et al. | |
| 5,825,193 A | * 10/1998 | Nakata et al. | ............. 324/763 |
| 5,838,161 A | 11/1998 | Akram et al. | |
| 5,886,530 A | 3/1999 | Fasnacht et al. | |
| 6,020,745 A | 2/2000 | Taraci | |
| 6,069,480 A | 5/2000 | Sabounchi et al. | |
| 6,340,302 B1 | * 1/2002 | Ladd | ........................... 439/40 |

* cited by examiner

*Primary Examiner*—Evan Pert
*Assistant Examiner*—Tung X. Nguyen
(74) *Attorney, Agent, or Firm*—TraskBritt

(57) ABSTRACT

A large-scale substrate carries semiconductor devices and at least one pair of common conductive regions in communication therewith. Each common conductive region is configured to be electrically connected with both a force contact and a sense contact of burn-in stressing equipment. Such equipment includes at least one pair of force contacts for applying a force voltage across a pair of common conductive regions and, thus, across the large-scale substrate. A corresponding pair of sense contacts facilitates monitoring of a voltage applied across each of the semiconductor devices by the force contacts. Methods and systems for evaluating a voltage that has been applied to two or more semiconductor devices by way of a single pair of force contacts are also disclosed, as are methods and systems for, in response to a measured voltage, modifying the force voltage so that a desired voltage may be applied across each of the semiconductor devices.

17 Claims, 2 Drawing Sheets

METHOD FOR WAFER-LEVEL BURN-IN STRESSING OF SEMICONDUCTOR DEVICES AND SEMICONDUCTOR DEVICE SUBSTRATES CONFIGURED TO EFFECT THE METHOD

BACKGROUND OF THE INVENTION

1. Field of the Invention

The present invention relates generally to methods for concurrently burn-in stressing a plurality of semiconductor devices. More specifically, the present invention relates to so-called wafer-level burn-in stressing methods that include the application of a substantially constant voltage to each semiconductor device being concurrently stressed. More particularly, the present invention relates to wafer-level burn-in stressing methods that monitor the voltage being concurrently applied to a collection of semiconductor devices and that make appropriate adjustments to the voltage being applied to the semiconductor devices, as well as to apparatus for effecting such methods.

2. Background of Related Art

Conventionally, semiconductor devices have been burn-in stressed by exposing the semiconductor devices to an increased temperature for a prolonged period of time and, while subjecting the semiconductor devices to such an increased temperature, by applying a substantially constant voltage, typically above the operating voltage of the semiconductor devices, thereto. The goal of burn-in stressing is to induce failure in operationally borderline semiconductor devices that would have been likely to fail before the end of their prescribed or desired lifetime. Such failure is induced by driving any contaminants within the semiconductor devices into the electrical circuitry thereof or by causing any other defects in the semiconductor device to cause electrical shorting or opening therein.

Conventionally, burn-in stressing was conducted on individual semiconductor devices in order to facilitate the handling of such devices for burn-in stressing; these devices were typically packaged prior to burn-in stressing. Burn-in stressing of individual semiconductor devices requires the contacts of each individual semiconductor device to communicate with test equipment. Moreover, when packaged semiconductor devices fail burn-in stressing, the expense and time associated with packaging these failed semiconductor devices are wasted. There is an increasing demand in the industry for bare semiconductor devices that have been burn-in stressed, or "burned-in."

Semiconductor devices may also be burn-in stressed on a larger scale, such as a so-called "wafer scale." Typically, wafer scale burn-in stressing equipment includes contacts for communicating with the bond pads of each individual semiconductor device formed on a wafer or other large-scale substrate. This type of wafer scale burn-in stressing is effected by establishing an electrical connection between each contact of the test equipment and its corresponding bond pad of a semiconductor device on the wafer or other large-scale substrate. As a state-of-the-art wafer typically includes a great number of semiconductor devices, the number of contacts that is required in such burn-in stressing equipment to effect wafer-level burn-in is also quite large. Accordingly, this type of wafer-level burn-in stressing equipment may be very expensive. Moreover, as different wafers may include semiconductor devices with different bond pad arrangements or different dimensions, each type of wafer must be stressed with wafer-level burn-in stressing equipment that has contacts in specific, suitable locations for stressing semiconductor devices with a particular bond pad arrangement and particular dimensions.

More recently, wafers have been fabricated with force contacts that are common to and in electrical communication with groups of semiconductor devices or all of the semiconductor devices fabricated on the wafer. Wafers and other large-scale substrates that include common conductive regions that are common to groups of semiconductor devices facilitate the simultaneous stressing of all of the semiconductor devices as a pair of force contacts is electrically connected thereto. For example, one set of force contacts may be electrically connected to the common conductive regions of such a wafer or other large-scale substrate and a force voltage applied to the wafer or other large-scale substrate by that set of force contacts. In addition, when the wafer or other large-scale substrate has one or more sets of common conductive regions that are common to a plurality of semiconductor devices, the burn-in stressing equipment is not limited to use with wafers or other large-scale substrates with semiconductor devices fabricated thereon that have specific, fixed bond pad arrangements and dimensions.

When a force voltage is applied by a pair of force contacts to the common conductive regions of such a wafer or other large-scale substrate, the voltage that is actually applied across the semiconductor devices varies from the force voltage that is applied to the force contacts. This variance in voltage is at least partially attributed to electrical resistance caused by the material of the force contacts themselves, which is commonly referred to as "bulk electrode resistance", as well as by contact resistance, which occurs at the interface between the force contacts and the common conductive regions to which the force contacts are secured or between the common conductive regions and the underlying substrate or an adjacent electrical trace. The contact resistance may vary greatly over time or due to process variations, such as oxidation or contamination of the contacts. Another component that may cause variations in the voltage at the wafer is due to the current loads of the semiconductor devices themselves, which may also vary over time or due to process variations (e.g., if a fuse methodology is used to drive grossly defective semiconductor devices). The various potential variations may result in a large variation of the voltage seen at a substrate, such as a wafer. By way of example, if 1,000 semiconductor devices, or dice, are carried upon a substrate and electrically connected to the same pairs of force and sense contacts and a 50 mA current draw is realized at each semiconductor device, the result may be a 50 A current draw across the substrate. With such a relatively large current, any changes in contact resistance, even relatively small changes, may result in large voltage changes across the substrate. Continuing with the example of a 50 A current draw, if contact resistance were to vary by only 100 m$\Omega$, the force voltage would vary by 5 V (V=I×R; 50 A×100 m$\Omega$=5 V). As the operational voltage of semiconductor devices is typically about 3.3 V or less, voltage variations of greater than about 100–150 mV are unacceptable. Thus, a voltage variation of 5 V would certainly be unacceptable. If the proper voltage is not applied to each semiconductor device during burn-in stressing, its reliability cannot be guaranteed.

Known stressing equipment for wafers or other large-scale substrates uses a single pair of force contacts to supply the desired voltage to a wafer or other large-scale substrate. An electrical connection between the semiconductor devices on a wafer or other large-scale substrate and such common force contacts may be established by biasing the force contacts against one or more pairs of common conductive regions on the wafer or other large-scale substrate, which in turn communicate with conductive traces that communicate with the corresponding power ($V_{CC}$) and ground ($V_{SS}$) bond pads of semiconductor devices carried by the wafer or other large-scale substrate. The common conductive regions are typically located adjacent the periphery of the wafer or other large-scale substrate.

Wafers or other large-scale substrates with common conductive regions that are configured to receive common force contacts are not, however, configured to facilitate the evaluation of the voltage being applied to the wafer or other large-scale substrate or to the semiconductor devices thereof which communicate with the common conductive regions.

SUMMARY OF THE INVENTION

The present invention includes apparatus which facilitate the application of a force voltage simultaneously to a plurality of semiconductor devices through force contacts that may be electrically connected to one or more pairs of common conductive regions formed upon a wafer or other large-scale semiconductor substrate, which common conductive regions communicate with a plurality of the semiconductor devices formed on the wafer or other large-scale substrate. In addition, the present invention includes wafers and other large-scale substrates with one or more pairs of common conductive regions to which a force voltage may be applied to the wafer or other large-scale substrate and through which the voltage that is actually applied to the semiconductor devices carried upon the wafer or other large-scale substrate may be sensed. The present invention also includes burn-in stressing equipment and systems that include one or more pairs of both stress contacts and sense contacts, which respectively apply a force voltage to a wafer or other large-scale substrate and sense the voltage that has been applied to semiconductor devices on the wafer or other large-scale substrate. The present invention also includes methods for wafer level burn-in stressing of semiconductor devices.

An exemplary embodiment of a large-scale semiconductor substrate incorporating teachings of the present invention includes a plurality of semiconductor devices fabricated thereon and at least one pair of common conductive regions in electrical communication with at least some of the plurality of semiconductor devices. Each of the common conductive regions is configured to receive both a force contact and a sense contact. By receiving force contacts, a force voltage may be applied to the wafer or other large-scale substrate at a pair of common conductive regions and, thus, a voltage may be applied to each semiconductor device that communicates with that pair of common conductive regions. The common conductive regions of wafers and other large-scale substrates incorporating teachings of the present invention are also configured to receive sense contacts that facilitate the evaluation of the voltage applied across the wafer or other large-scale substrate and, thus, to each of the semiconductor devices that communicate with that pair of common conductive regions. A large-scale semiconductor substrate incorporating teachings of the present invention is, therefore, configured to facilitate the simultaneous stressing of each semiconductor device that communicates with a pair of common conductive regions, as well as the evaluation of the voltage being applied to the semiconductor devices.

Stress and evaluation apparatus that may be used with large-scale substrates that incorporate teachings of the present invention include at least one pair of common force, or stress, contacts and one pair of common sense contacts. Such apparatus are configured to communicate with the common power and ground force contacts of a wafer or other large-scale substrate so as to apply a desired force voltage to the wafer or other large-scale substrate and to each of the semiconductor devices communicating with each pair of common conductive regions to which a pair of force contacts is electrically connected. In addition, each pair of sense contacts of such apparatus is configured to be electrically connected to and, thus, communicate with a corresponding pair of common conductive regions of the wafer or other large-scale substrate so as to facilitate monitoring of the voltage applied across the wafer or other large-scale substrate. Accordingly, the sense contacts of a stress and evaluation apparatus of the present invention may communicate with a volt meter of a known type, which evaluates the voltage being applied to the wafer or other large-scale substrate, as well as to the semiconductor devices thereof. Accordingly, feedback systems or control circuitry of known types may be used in conjunction with burn-in stressing of the semiconductor devices.

One or both of the volt meter and the stressing and evaluation apparatus may communicate with control circuitry, or a feedback component, which evaluates the voltage being applied across a wafer or other large-scale substrate through the common conductive regions thereof by a pair of force contacts. The control circuitry may also cause the stressing device to vary the voltage that is being applied across the wafer or other large-scale substrate, as needed, to maintain the application of a substantially constant, desired voltage to the wafer or other large-scale substrate through the force contacts.

In an exemplary method of the present invention, a force voltage is applied by a pair of (i.e., power and ground) force contacts to corresponding locations on a pair of common conductive regions of a wafer or other large-scale substrate and, thus, to a plurality of semiconductor devices that communicate with the common conductive regions. While a force voltage is being applied across the wafer or other large-scale substrate, the voltage that is actually applied across the semiconductor devices thereof is evaluated at the pair of sense contacts. Such evaluation is preferably effected at sense terminal locations of the pair of common conductive regions of the wafer or other large-scale substrate. In addition, the method may include modifying the voltage being applied by a pair of common force contacts and, thus, across the wafer or other large-scale substrate, in response to the evaluated voltage.

Other features and advantages of the present invention will become apparent to those of skill in the art through consideration of the ensuing discussion, the accompanying drawings, and the appended claims.

BRIEF DESCRIPTION OF THE DRAWINGS

In the drawings, which illustrate exemplary embodiments of the present invention.

DETAILED DESCRIPTION OF THE INVENTION

Figure 1:
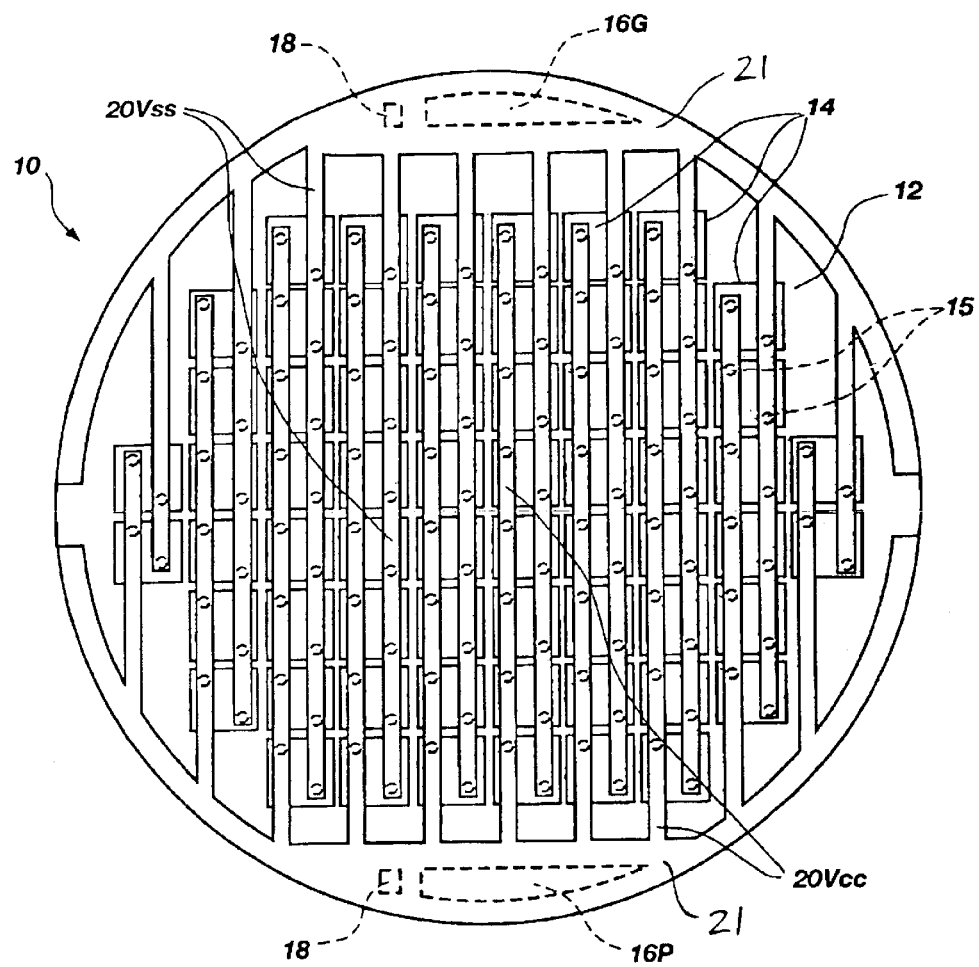
FIG. 1 is a top view of an exemplary large-scale substrate, in this case a semiconductor wafer, incorporating teachings of the present invention.

With reference to FIG. 1, an exemplary embodiment of a large-scale semiconductor substrate 10 incorporating teachings of the present invention is illustrated. Substrate 10 is depicted as a silicon wafer having a plurality of semiconductor devices 14 fabricated on an active surface 12 thereof. Other known types of large-scale semiconductor substrates may alternatively be used as substrate 10, including, without limitation, full or partial wafers formed from silicon, gallium arsenide, indium phosphide, or another semiconductive material, and silicon-on-insulator (SOI) type substrates, such as silicon-on-glass (SOG), silicon-on-sapphire (SOS), silicon-on-ceramic (SOC), and the like.

Semiconductor devices 14, which may be any known type of semiconductor device, such as memory devices (e.g., SRAM, DRAM, EPROM, EEPROM, etc.) or microprocessors, are fabricated by known processes.

Figure 1A:
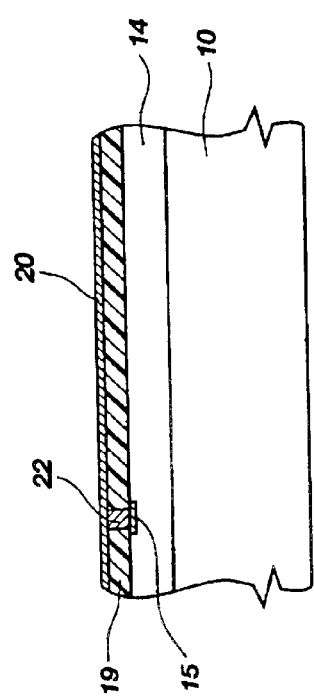
FIG. 1A is a partial cross-sectional representation taken through a $V_{SS}$ or $V_{CC}$ bond pad of a semiconductor device carried upon the semiconductor wafer shown in FIG. 1.

As shown in FIG. 1, substrate 10 also includes a pair of common conductive regions 21 formed on active surface 12, each of which is configured to have both a force contact 16 (shown as force contacts 16G and 16P in FIG. 1) and a sense contact 18 electrically connected thereto. Each common conductive region 21 communicates, by way of conductive traces 20, with two or more of the semiconductor devices 14 that are located on active surface 12. Conductive traces 20 extend across active surface 12 and may extend over semiconductor devices 14, with a conductive trace 20Vcc which comprises a Vcc bus and a conductive trace 20Vss which comprises a Vss bus respectively being electrically connected to appropriate bond pads 15 of a plurality of (e.g., all) semiconductor devices 14 on substrate 10. By way of example only, common conductive regions 21 and conductive traces 20 may comprise a sacrificial metal layer which has been formed over active surface 12 and is spaced apart and electrically isolated from active surface 12 and circuitry of semiconductor devices 14 by way of the upper insulative layer (e.g., a glass or polymer layer) of semiconductor devices 14. As shown in FIG. 1A, another, intervening insulative layer 19 (which may comprise any suitable dielectric material, such as a polymer, silicon oxide, silicon nitride, etc.) may be formed over semiconductor devices 14 and other regions of substrate 10 so as to provide further electrical insulation. By way of example only, conductive traces 20 may electrically communicate with corresponding bond pads 15 of semiconductor devices 14 by way of conductive vias 22 that extend through intervening insulative layer 19. Known semiconductor device fabrication processes, such as blanket deposition and patterning techniques, may be used to fabricate insulative layer 19, force contacts 16, sense contacts 18, conductive traces 20, and conductive vias 22.

Figure 2:
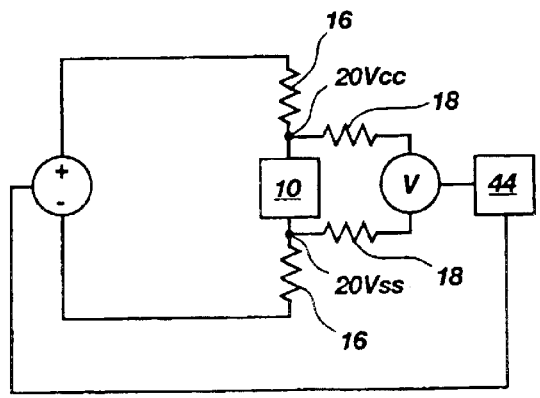
FIG. 2 is an electrical diagram schematically illustrating an electrical circuit of the present invention.

Referring again to FIG. 1, as well as to FIG. 2, each pair of common conductive regions 21 facilitates the electrical connection of a force contact 16 to each semiconductor device 14 that communicates, by way of conductive traces 20, with that pair of common conductive regions 21. Accordingly, one force contact of a pair is a power ($V_{CC}$) contact 16P, while the other force contact of that pair is a ground contact 16G.

Figure 3:
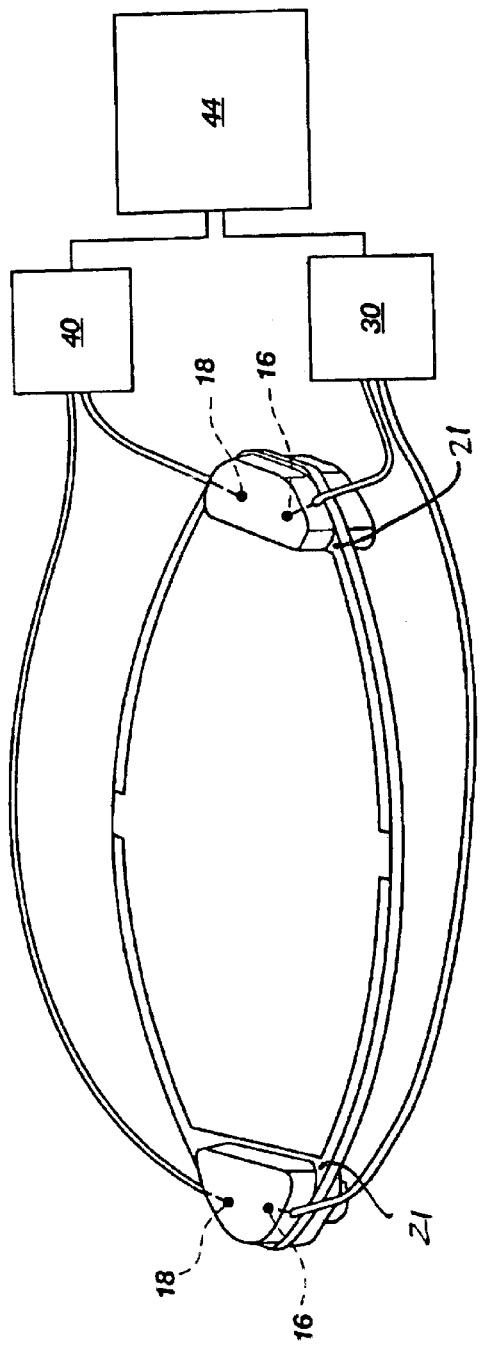
FIG. 3 is a schematic representation of a system incorporating teachings of the present invention.

With reference to both FIGS. 1 and 3, in wafer-scale stressing of each of the semiconductor devices 14 that communicates, through common conductive regions 21 and conductive traces 20, with a specific pair of force contacts 16, a force voltage is applied by test equipment 30, across power contact 16P and ground contact 16G (not shown in FIG. 3). The force voltage is communicated through conductive traces 20 to each semiconductor device 14 that communicates with power contact 16P. As the material or materials from which power contact 16P and ground contact 16G are formed generates bulk electrode resistance, and because of the contact resistance present at the interfaces between the material or materials of force contacts 16 and common conductive regions 21 to which force contacts 16 are electrically connected, the contact resistance between common conductive regions 21 and substrate 10, or the contact resistance present at the interface between the material or materials of common conductive regions 21 and that of conductive traces 20, if any, the voltage that is actually communicated to semiconductor devices 14 for stressing thereof may be much less than the actual force voltage. By way of example, in order to overcome the bulk electrode resistance and the contact resistance that occur while supplying a voltage to common conductive regions 21 of substrate 10 with force contacts 16, it may be necessary to apply as much as 4 V across force contacts 16 in order to supply each semiconductor device 14 with about 3.3 V.

With continued reference to FIG. 3, as it may otherwise be difficult to accurately determine how much voltage should be applied across a pair of force contacts 16 and a corresponding pair of common conductive regions 21 to supply the appropriate voltage to each semiconductor device 14 in communication with that pair of force contacts 16, a pair of voltage sense contacts 18 is associated with each pair of force contacts 16. Sense contacts 18 may be positioned in close physical proximity to (e.g., adjacent to) force contacts 16 so as to optimize the accuracy with which a measurement of the voltage applied to substrate 10 may be obtained.

As shown in FIG. 3, as a force voltage is being applied across a pair of common conductive regions 21 and, thus, across substrate 10 by a pair of force contacts 16, the voltage between that pair of common conductive regions 21 may be monitored, or sensed, by use of the corresponding pair of sense contacts 18. As illustrated, a pair of sense contacts 18 that communicates with a volt meter 40 of a known type may be brought into electrical contact with a pair of common conductive regions 21 so as to communicate the voltage across the pair of sense contacts 18 to volt meter 40.

The voltage sensed by volt meter 40 may then be evaluated to determine whether an appropriate voltage is being applied across substrate 10, as well as whether the force voltage applied by force contacts 16 across common conductive regions 21 and, thus, across substrate 10 should be increased or decreased so that the appropriate voltage may be applied across each semiconductor device 14.

As an example of such evaluation, control circuitry 44 of a known type (e.g., a computer processor or smaller group of logic circuits under control of suitable programming) may communicate with volt meter 40, or may include volt meter 40. Upon receiving signals indicative of the voltage that is present across sense contacts 18, control circuitry 44 determines whether the force voltage being applied across substrate 10 by the force contacts 16 that correspond to sense contacts 18 used in such evaluation should be increased or decreased, as known in the art, to supply more or less voltage to the semiconductor devices 14 communicating with that pair of force contacts 16.

If control circuitry 44 determines that the force voltage should be adjusted, control circuitry 44 may then cause test equipment 30, by way of signals in the form of carrier waves, as also known in the art, to adjust the force voltage. Control circuitry 44 may also calculate the appropriate change needed to apply a desired force voltage across substrate 10. If, for example, it is desired that a test voltage of 3.3 V be applied to each semiconductor device 14, but volt meter 40 measures a voltage of 2.9 V at sense contacts 18 of substrate 10, control circuitry 44 causes test equipment 30 to apply an appropriate force voltage to force contacts 16 to increase the voltage applied across the corresponding semiconductor devices 14 to 3.3 V.

The use of a system such as that depicted in FIG. 3 in connection with a substrate 10 incorporating teachings of the present invention facilitates the application of a substantially constant amount of voltage across a plurality of semiconductor devices 14 by way of a pair of force contacts 16 that is electrically connected to a pair of conductive regions 21 that is common to each of the plurality of semiconductor devices 14. Accordingly, the methods of the present invention are particularly useful in wafer-level burn-in stressing processes, wherein a substantially constant voltage must be applied to a plurality of semiconductor devices over a prolonged period of time and in the presence of an elevated temperature.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A system for stressing a plurality of semiconductor devices formed upon a single substrate, comprising:
    test equipment for applying a force voltage to the substrate, the test equipment including:
        at least one pair of force contacts configured to be electrically connected with a corresponding pair of common conductive regions of the single substrate and in communication with the plurality of semiconductor devices thereon; and
        at least one pair of sense contacts configured to be electrically connected with the corresponding pair of common conductive regions;
    a volt meter in communication with the at least one pair of sense contacts; and
    control circuitry in communication with the volt meter and the test equipment for causing the test equipment to adjust the force voltage.

2. The system of claim 1, wherein the control circuitry receives data representative of a voltage measured by the volt meter and, in response to the voltage, causes the test equipment to adjust the force voltage.

3. The system of claim 2, wherein the control circuitry receives from the volt meter carrier waves for the data representative of the voltage measured by the volt meter.

4. The system of claim 2, wherein the control circuitry generates carrier waves to cause the test equipment to adjust the test-force voltage.

5. The system of claim 2, wherein the control circuitry includes control circuitry to calculate an appropriate force voltage to be applied to the corresponding pair of common conductive regions of the single substrate by the at least one pair of force contacts to cause a desired voltage to be applied across each semiconductor device of the plurality of semiconductor devices.

6. The system of claim 5, wherein the control circuitry comprises a processor under control of a program for adjusting the force voltage based on the voltage measured by the volt meter by way of the at least one pair of sense contacts at the corresponding pair of common conductive regions of the single substrate.

7. A method for evaluating a stress voltage applied to semiconductor devices during burn-in stressing thereof, comprising:
    applying a force voltage to a plurality of semiconductor devices formed on a large-scale substrate by way of a pair of force contacts in common communication with the plurality of semiconductor devices;
    monitoring a voltage applied to the large-scale substrate between the pair of force contacts; and
    automatically adjusting the force voltage in response to monitoring the voltage.

8. The method of claim 7, wherein the monitoring the voltage comprises monitoring the voltage by use of a pair of sense contacts in common communication with the plurality of semiconductor devices.

9. The method of claim 7, wherein the monitoring the voltage comprises monitoring the voltage at locations between the pair of force contacts and the plurality of semiconductor devices.

10. A method for burn-in stressing a plurality of semiconductor devices, comprising:
    applying a force voltage to each of the plurality of semiconductor devices by way of a pair of force contacts in communication with each of the plurality of semiconductor devices;
    monitoring a sensed voltage between the pair of force contacts;
    evaluating the sensed voltage relative to a desired voltage; and
    automatically adjusting a voltage of the force voltage based on the evaluating.

11. The method of claim 10, wherein the monitoring is effected at locations between the pair of force contacts.

12. The method of claim 10, wherein the monitoring is effected at locations adjacent to the pair of force contacts.

13. The method of claim 10, wherein the monitoring is effected at a pair of common conductive regions on a substrate upon which the plurality of semiconductor devices is carried.

14. The method of claim 10, wherein the automatically adjusting comprises adjusting the force voltage to cause substantially a desired predetermined voltage to be applied to a substrate upon which the plurality of semiconductor devices is carried.

15. The method of claim 10, wherein the automatically adjusting is effected by a carrier wave.

16. The method of claim 10, further comprising transmitting data representative of the sensed voltage to a processor or group of logic circuits prior to the evaluating.

17. The method of claim 16, wherein the evaluating comprises evaluating the data representative of the sensed voltage.

* * * * *